(12) United States Patent
Yue et al.

(10) Patent No.: US 6,674,108 B2
(45) Date of Patent: Jan. 6, 2004

(54) GATE LENGTH CONTROL FOR SEMICONDUCTOR CHIP DESIGN

(75) Inventors: Cheisan J. Yue, Roseville, MN (US); Eric E. Vogt, Minneapolis, MN (US); Todd N. Handeland, New Hope, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/745,239

(22) Filed: Dec. 20, 2000

(65) Prior Publication Data

US 2002/0074564 A1 Jun. 20, 2002

(51) Int. Cl.[7] .................... H01L 29/76; H01L 29/94
(52) U.S. Cl. ................. 257/288; 257/379; 257/380; 257/381
(58) Field of Search ................ 257/213, 288, 257/351, 369, 377, 379, 380, 381, 385, 200, 296, 297, 306, 408, 401; 438/384, 382, 396

(56) References Cited

U.S. PATENT DOCUMENTS

| 4,495,222 | A |   | 1/1985  | Anderson et al. |
| 4,868,627 | A |   | 9/1989  | Yamada et al. |
| 4,994,402 | A |   | 2/1991  | Chiu |
| 5,470,775 | A | * | 11/1995 | Nariani ..................... 438/384 |
| 5,618,749 | A | * | 4/1997  | Takahashi et al. .......... 438/384 |
| 6,261,883 | B1 |  | 7/2001  | Koubuchi et al. |
| 6,297,109 | B1 | * | 10/2001 | Chan et al. ................. 438/300 |
| 6,306,681 | B1 | * | 10/2001 | Ahn et al. .................. 438/107 |
| 6,348,392 | B1 | * | 2/2002  | Nakayama et al. ......... 438/382 |

FOREIGN PATENT DOCUMENTS

| EP | 0 936 669 A1 | 8/1999  |
| JP | 57 180138    | 11/1982 |
| JP | 63-67749     | 3/1988  |
| JP | 63 127575    | 5/1988  |
| JP | 2 105532     | 4/1990  |
| JP | 10-335333    | 12/1998 |
| JP | 2000 112114  | 4/2000  |

* cited by examiner

*Primary Examiner*—Phat X. Cao
*Assistant Examiner*—Theresa T. Doan
(74) *Attorney, Agent, or Firm*—Schiff Hardin & Waite

(57) ABSTRACT

A semiconductor device includes first and second polysilicon areas on a chip. The first polysilicon area corresponds to circuit elements of the semiconductor device. At least some of the first polysilicon corresponds to polysilicon gates. At least some of the second polysilicon area comprises contacts of the semiconductor device. Metal covers the polysilicon contacts.

34 Claims, 8 Drawing Sheets

US 6,674,108 B2

GATE LENGTH CONTROL FOR SEMICONDUCTOR CHIP DESIGN

TECHNICAL FIELD OF THE INVENTION

The present invention relates to the design of semiconductor chips such as RF switches.

BACKGROUND OF THE INVENTION AND PRIOR ART

CMOS device performance is affected, often critically, by dimension control of the device's gate length. A manufacturable gate definition process includes both gate patterning and etching. For example, while it is generally desirable to use as little polysilicon as possible in the formation of the gates of RF CMOS devices, the typical polysilicon etch process used in the formation of such CMOS devices requires the use of more polysilicon than is desired for these gates.

That is, gate etching is sensitive to the "micro-loading" effect. Micro-loading is usually defined as the utilization of the chip area between the gate and the chip. Micro-loading is generally not a concern for typical LSI circuits which have ratios of 10% or more of gate area to total chip area. However, for certain types of applications, such as RF switches, which demand both extremely high performance and a limited gate area, a significant adjustment of the gate etch chemistry or bias condition is usually exploited because of the need for a low gate area.

The present invention permits the use of conventional gate etch processes by placing polysilicon pads underneath probe pads during chip layout. Accordingly, the overall ratio of polysilicon to chip area can be increased so that conventional gate etching processes can be used, while the ratio of gate polysilicon to chip area can be kept small for better device operation. In addition, by increasing the polysilicon area in the chip layout, the gate etch process margin for deep sub-micron applications is improved.

SUMMARY OF THE INVENTION

In accordance with one aspect of the present invention, a semiconductor device comprises first and second polysilicon and metal pads. The first polysilicon forms circuit elements of the semiconductor device on a chip, and at least some of the circuit elements comprise polysilicon gates. The second polysilicon forms polysilicon pads of the semiconductor device on the chip. The metal pads cover the polysilicon pads.

In accordance with another aspect of the present invention, a semiconductor device chip comprises first, second, and third transistors, a plurality of polysilicon resistors, a plurality of polysilicon pads, and contacts. The first transistor comprises gate regions and alternating source and drain regions. Each gate region of the first transistor is between a pair of adjacent source and drain regions, and each gate region of the first transistor comprises polysilicon. The second transistor comprises gate regions and alternating source and drain regions. Each gate region of the second transistor is between a pair of adjacent source and drain regions, and each gate region of the second transistor comprises polysilicon. The third transistor comprises gate regions and alternating source and drain regions. Each gate region of the third transistor is between a pair of adjacent source and drain regions, and each gate region of the third transistor comprises polysilicon. The contacts cover the polysilicon pads.

In accordance with still another aspect of the present invention, a method of making an RF switch comprises forming a plurality of polysilicon gates on a chip, and forming a plurality of polysilicon pads on the chip so that there is substantially little RF coupling between the polysilicon pads and the polysilicon gates.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
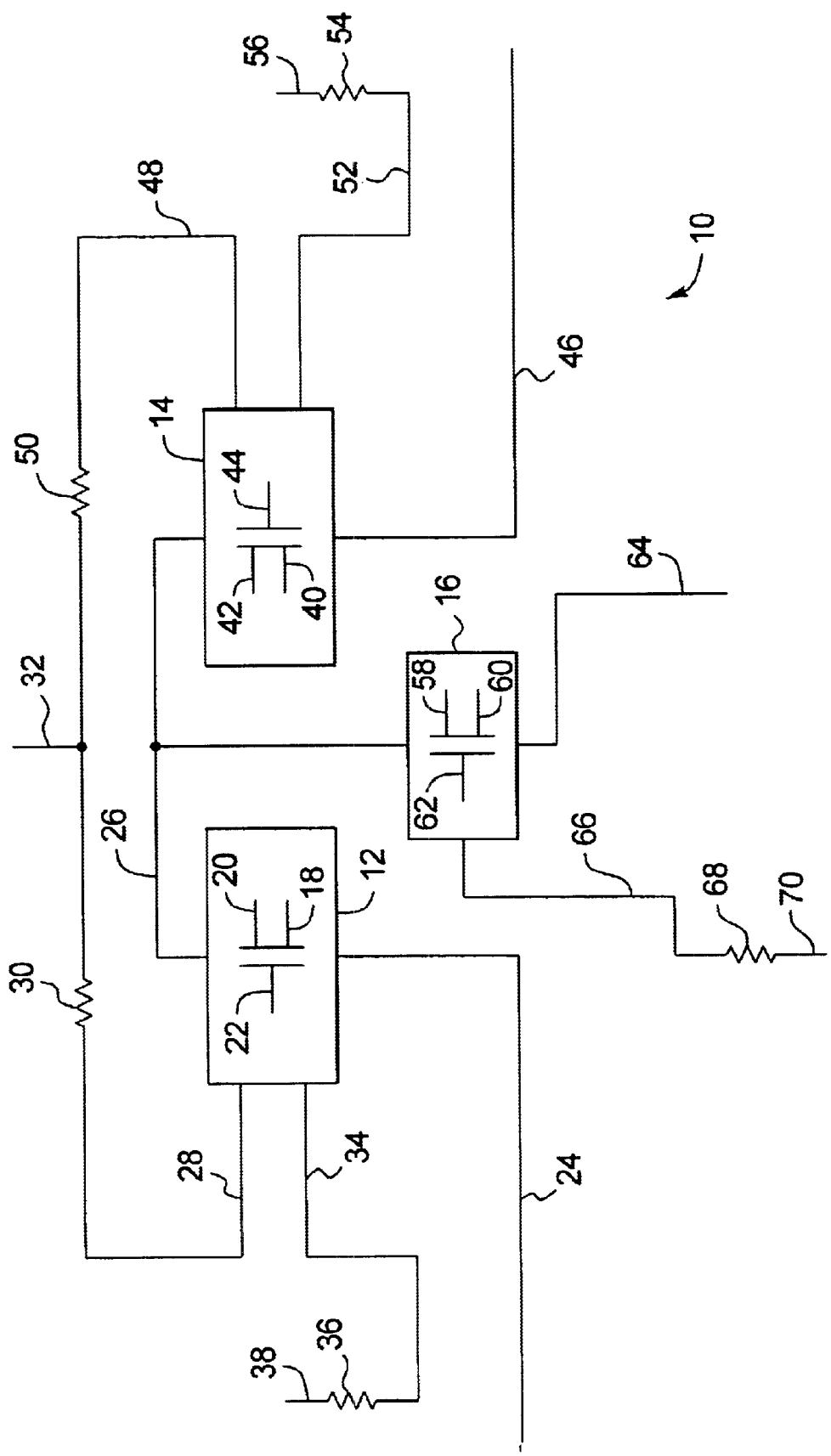
FIG. 1 shows a semiconductor device of a chip according to an embodiment of the present invention.

FIG. 1 shows, in schematic form, a semiconductor device 10 that forms part of a chip. The semiconductor device 10, for example, may comprise an RF switch and, although not shown, the chip may include a silicon substrate as is well known in semiconductor device fabrication. The semiconductor device 10 includes transistors 12, 14, and 16. The transistor 12 has a source 18, a drain 20, and a gate 22. The source 18 is coupled to a metal layer 24, the drain 20 is coupled to a metal layer 26, and the gate 22 is coupled to a metal layer 28. A resistor 30 couples the metal layer 28 to a metal layer 32. The channel of the transistor 12 is coupled to a metal layer 34 which is coupled by a resistor 36 to a metal layer 38.

The transistor 14 has a source 40, a drain 42, and a gate 44. The source 40 is coupled to a metal layer 46, the drain 42 is coupled to the metal layer 26, and the gate 44 is coupled to a metal layer 48. A resistor 50 couples the metal layer 48 to the metal layer 32. The channel of the transistor 14 is coupled to a metal layer 52 which is coupled by a resistor 54 to a metal layer 56.

The transistor 16 has a source 58, a drain 60, and a gate 62. The source 58 is coupled to the metal layer 26, the drain 60 is coupled to a metal layer 64, and the gate 62 is coupled to a metal layer 66. A resistor 68 couples the metal layer 66 to a metal layer 70.

Figure 2:
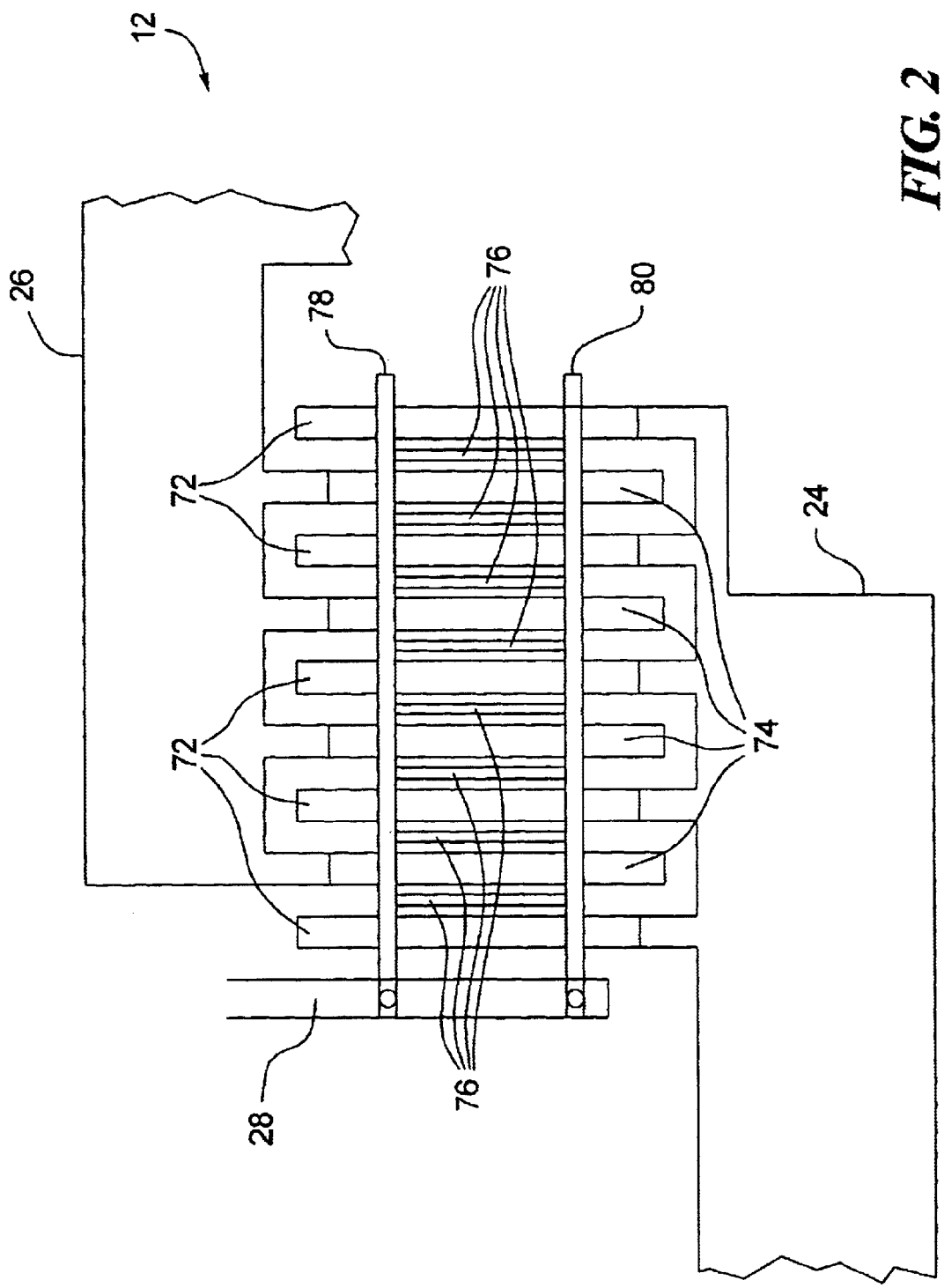
FIG. 2 shows in additional detail a first transistor of the semiconductor device shown in FIG. 1.

As shown in FIG. 2, the source 18 of the transistor 12 comprises a plurality of source regions 72 coupled together by the metal layer 24. Similarly, the drain 20 of the transistor 12 comprises a plurality of drain regions 74 coupled together by the metal layer 26. The source and drain regions 72 and 74 are interleaved as shown in FIG. 2. The gate 22 of the transistor 12 comprises a plurality of polysilicon gate regions 76 coupled together by polysilicon strips 78 and 80, and the polysilicon strips 78 and 80 are coupled to the metal layer 28. Each of the gate regions 76 is between one of the source regions 72 and an adjacent one of the drain regions 74.

Figure 3:
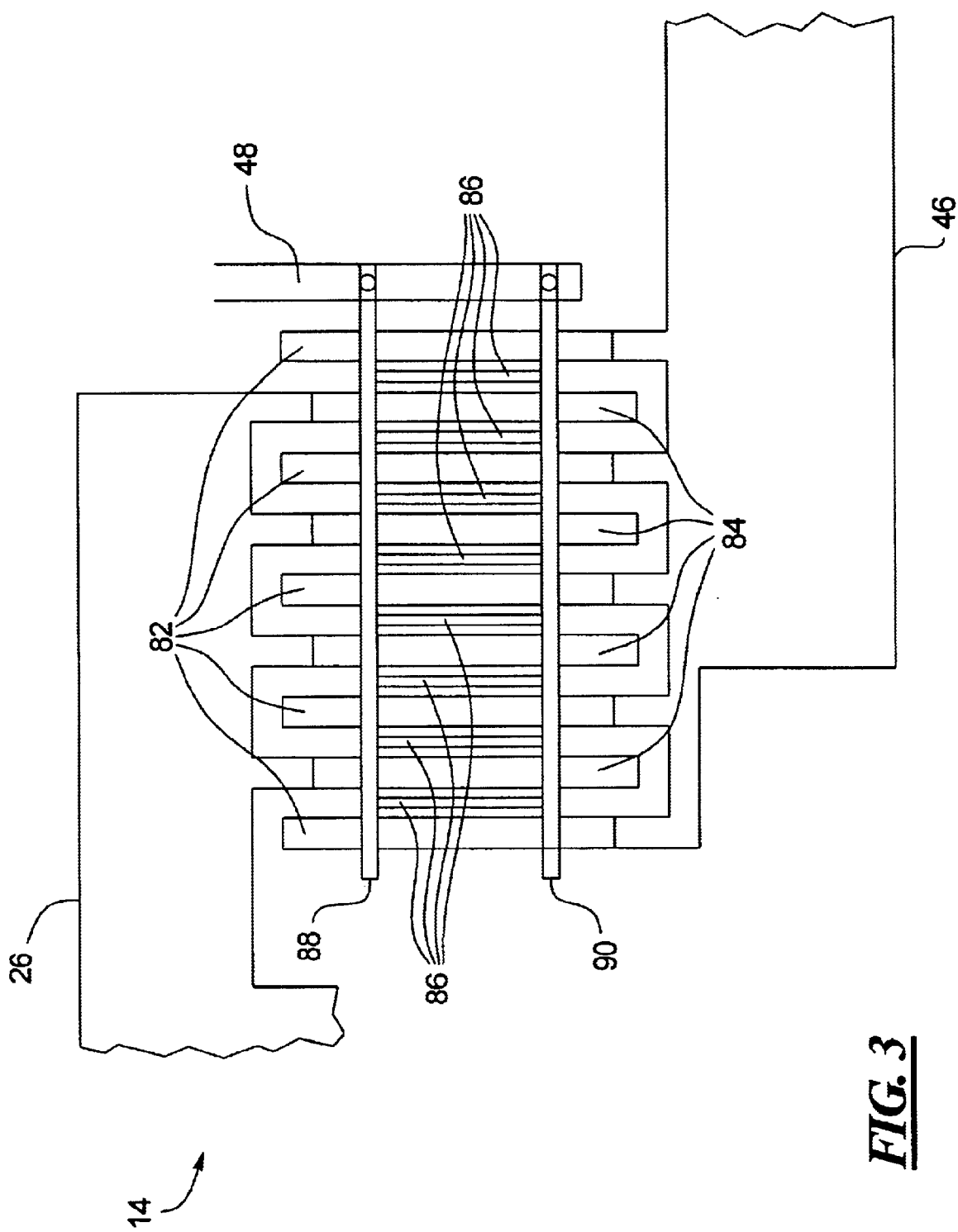
FIG. 3 shows in additional detail a second transistor of the semiconductor device shown in FIG. 1.

As shown in FIG. 3, the source 40 of the transistor 14 comprises a plurality of source regions 82 coupled together by the metal layer 46. Similarly, the drain 42 of the transistor 14 comprises a plurality of drain regions 84 coupled together by the metal layer 26. The source and drain regions 82 and 84 are interleaved as shown in FIG. 3. The gate 44 of the transistor 14 comprises a plurality of polysilicon gate regions 86 coupled together by polysilicon strips 88 and 90, and the polysilicon strips 88 and 90 are coupled to the metal layer 48. Each of the gate regions 86 is between one of the source regions 82 and an adjacent one of the drain regions 84. For clarity, the couplings between the metal layers 34 and 52 and the channels of the corresponding transistors 12 and 14 are not shown in FIGS. 2 and 3.

Figure 4:
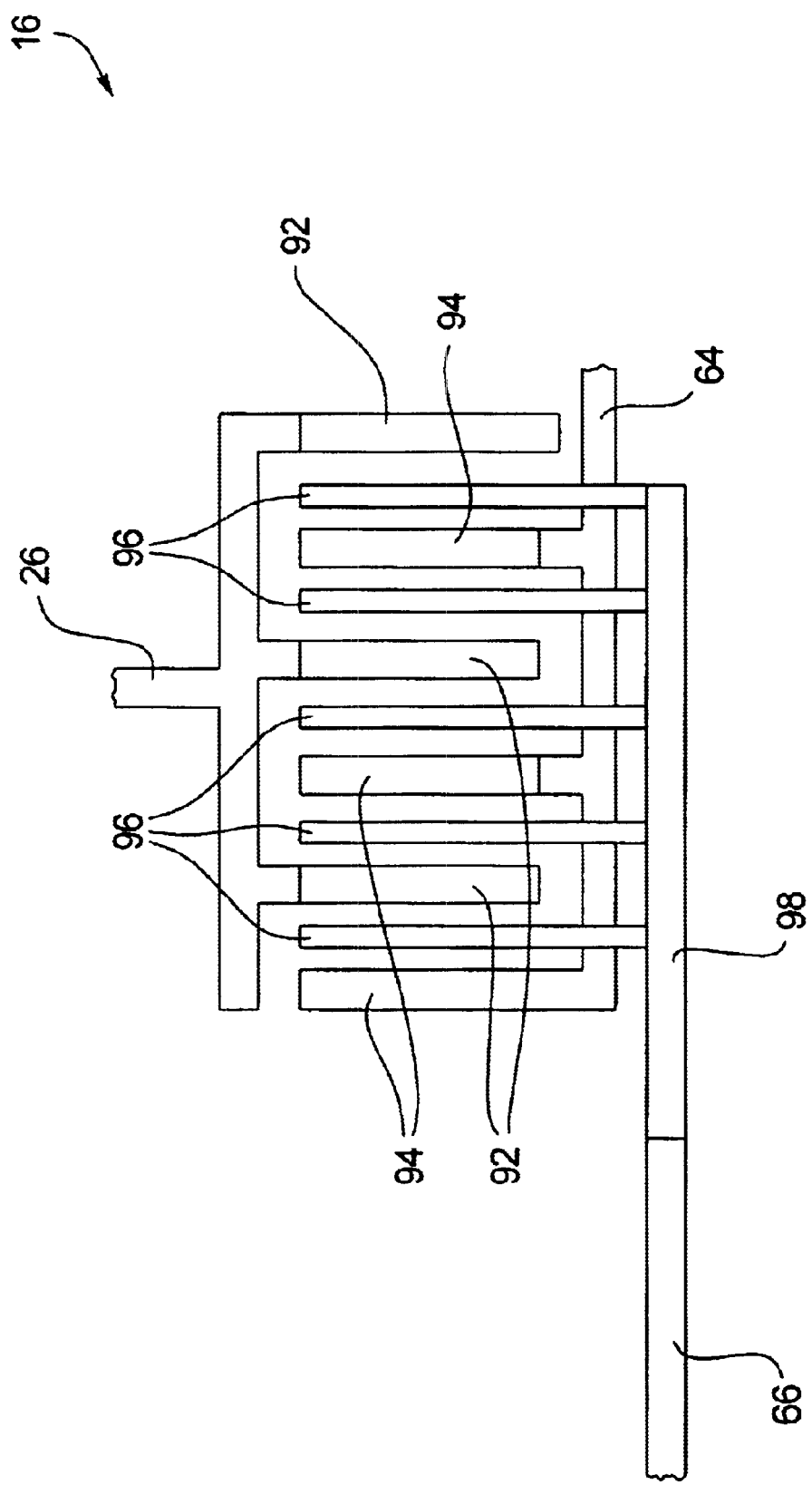
FIG. 4 shows in additional detail a third transistor of the semiconductor device shown in FIG. 1.

As shown in FIG. 4, the source 58 of the transistor 16 comprises a plurality of source regions 92 coupled together by the metal layer 26. Similarly, the drain 60 of the transistor 16 comprises a plurality of drain regions 94 coupled together by the metal layer 64. The source and drain regions 92 and 94 are interleaved as shown in FIG. 4. The gate 62 of the transistor 16 comprises a plurality of polysilicon gate regions 96 coupled together by a polysilicon strip 98, and the polysilicon strip 98 is coupled to the metal layer 66. Each of the gate regions 96 is between one of the source regions 92 and an adjacent one of the drain regions 94.

Figure 5:
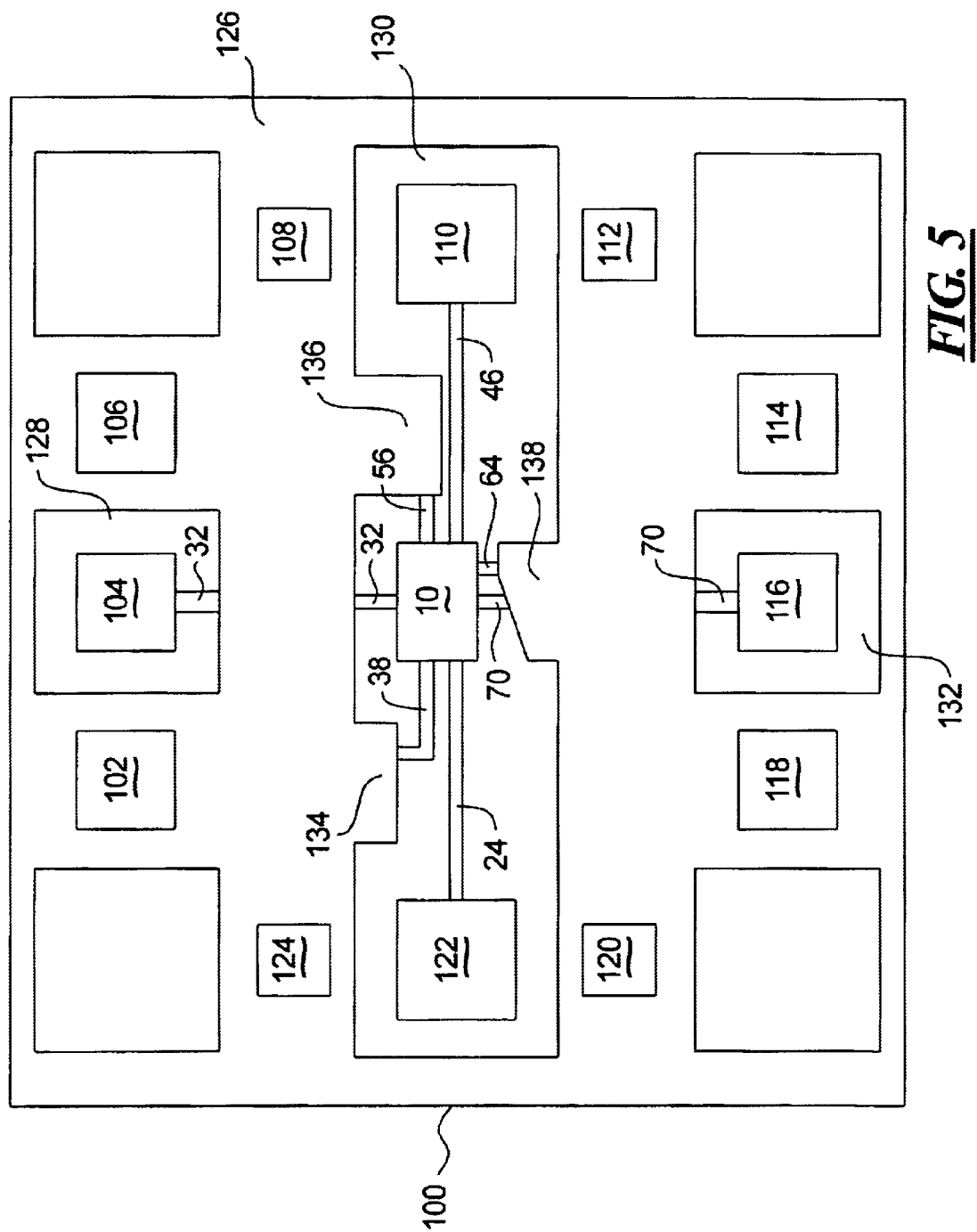
FIG. 5 shows a pad layout for the chip whose semiconductor device is shown in FIG. 1.

As shown in FIG. 5, a pad layout 100 for the chip which includes the semiconductor device 10 comprises probe pads 102, 104, 106, 108, 110, 112, 114, 116, 118, 120, 122, and 124. The probe pads 102, 106, 108, 112, 114, 118, 120, and 124 may be metal and may reside under a metal template 126 which is coupled to a reference potential such as ground. The probe pad 104 resides in a window 128 of the metal template 126, the probe pad 110 resides in a window 130 of the metal template 126, the probe pad 116 resides in a window 132 of the metal template 126, and the probe pad 122 resides in the window 130 of the metal template 126.

Also as shown in FIG. 5, the metal layer 32 extends below the metal template 126 and couples the gates 22 and 44 of the transistors 12 and 14 and the corresponding resistors 30 and 50 to the probe pad 104. The probe pad 104, for example, may function as a control terminal that carries a control signal to the gates 22 and 44 of the transistors 12 and 14. The metal layer 24 extends below the window 130 and couples the source 18 of the transistor 12 to the probe pad 122. The probe pad 122, for example, may function as an input terminal that carries an input signal, such as an input RF signal, to the source 18 of the transistor 12.

The metal layer 46 extends below the window 130 and couples the source 40 of the transistor 14 to the probe pad 110. The probe pad 110, for example, may function as an output terminal that carries an output signal, such as an output RF signal, from the transistor 14. The metal layer 70 extends below the metal template 126 and couples the gate 62 of the transistor 16 and the resistor 68 to the probe pad 116. The probe pad 116, for example, may function as a control terminal that carries a control signal to the gate 62 of the transistor 16.

The metal layer 38 couples the channel of the transistor 12 and the resistor 36 to a portion 134 of the metal template 126. Similarly, the metal layer 56 couples the channel of the transistor 14 and the resistor 54 to a portion 136 of the metal template 126. Finally, the metal layer 64 couples the drain 60 of the transistor 16 to a portion 138 of the metal template 126. The transistors 12, 14, and 16, as well as the resistors 30, 36, 50, 54, and 68, of the semiconductor device 10 are all located within the window 130 of the metal template 126.

Figure 6:
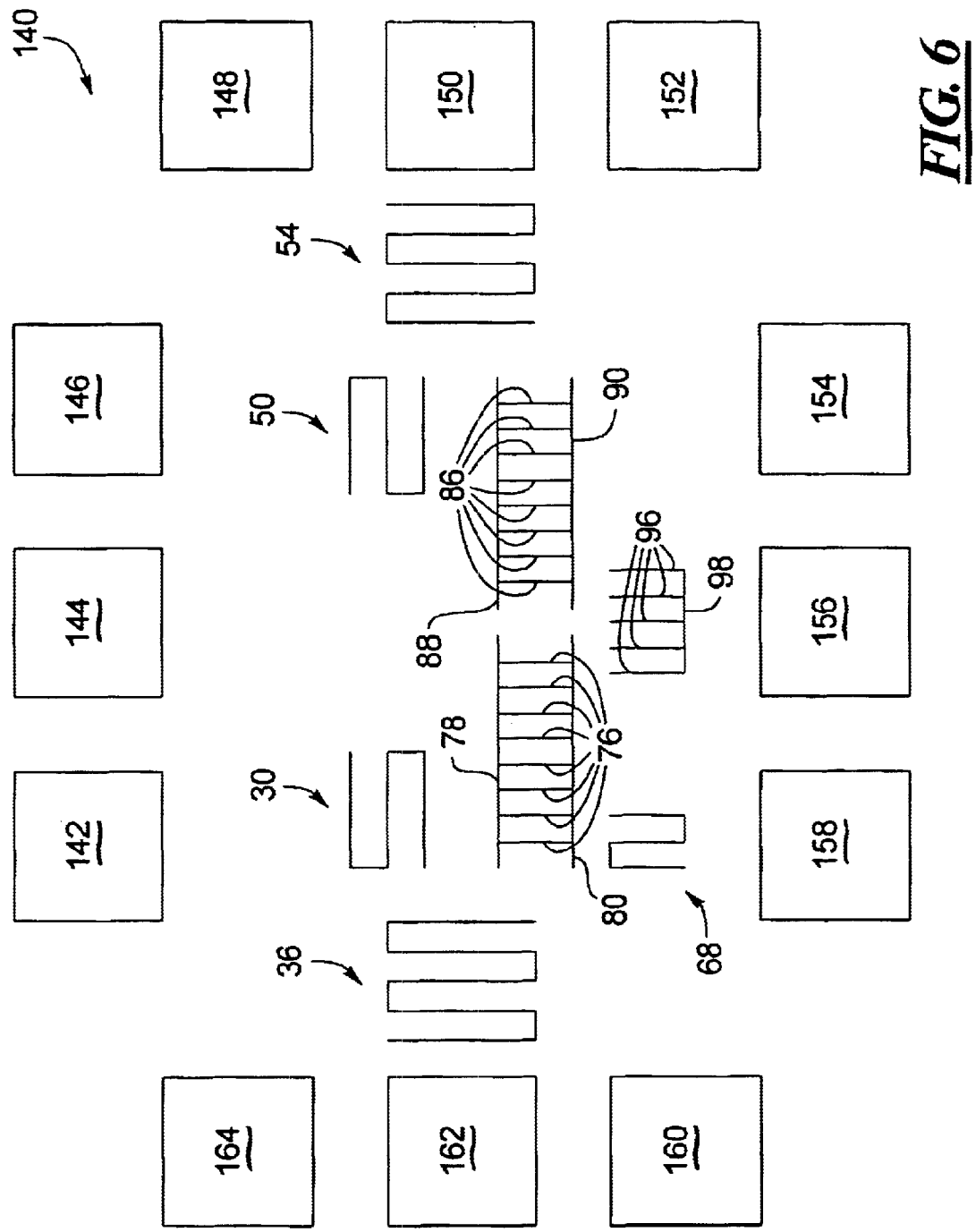
FIG. 6 shows a polysilicon layout for the chip whose semiconductor device is shown in FIG. 1.

FIG. 6 shows a polysilicon layout 140. The polysilicon layout 140 includes (i) the polysilicon gate regions 76 and the polysilicon strips 78 and 80 of the transistor 12, (ii) the polysilicon gate regions 86 and the polysilicon strips 88 and 90 of the transistor 14, and (iii) the polysilicon gate regions 96 and the polysilicon strip 98 of the transistor 16. Additionally, the resistors 30, 36, 50, 54, and 68 are formed of polysilicon strips and, therefore, are also illustrated in the polysilicon layout 140 of FIG. 6. The ends of the polysilicon strips of the resistors 30, 36, 50, 54, and 68 are coupled as shown in order to form the corresponding resistors. Finally, polysilicon pads 142, 144, 146, 148, 150, 152, 154, 156, 158, 160, 162, and 164 are provided in the polysilicon layout 140 of FIG. 6. All of the polysilicon of the polysilicon layout 140 is provided on the substrate of the chip containing the semiconductor device 10.

The polysilicon pad 142 is formed under the probe pad 102, the polysilicon pad 144 is formed under the probe pad 104, the polysilicon pad 146 is formed under the probe pad 106, the polysilicon pad 148 is formed under the probe pad 108, the polysilicon pad 150 is formed under the probe pad 110, the polysilicon pad 152 is formed under the probe pad 112, the polysilicon pad 154 is formed under the probe pad 114, the polysilicon pad 156 is formed under the probe pad 116, the polysilicon pad 158 is formed under the probe pad 118, the polysilicon pad 160 is formed under the probe pad 120, the polysilicon pad 162 is formed under the probe pad 122, and the polysilicon pad 164 is formed under the probe pad 124.

Each of the polysilicon gate regions 76 may have a length of $0.35\mu$ with a tolerance of $0.05\mu$. As viewed in FIGS. 2 and 6, gate length is the horizontal dimension of each of the gate regions 76. Similarly, each of the polysilicon gate regions 86 may have a length of $0.35\mu$ with a tolerance of $0.05\mu$, and each of the polysilicon gate regions 96 may have a length of $0.35\mu$ with a tolerance of $0.05\mu$.

Figure 7:
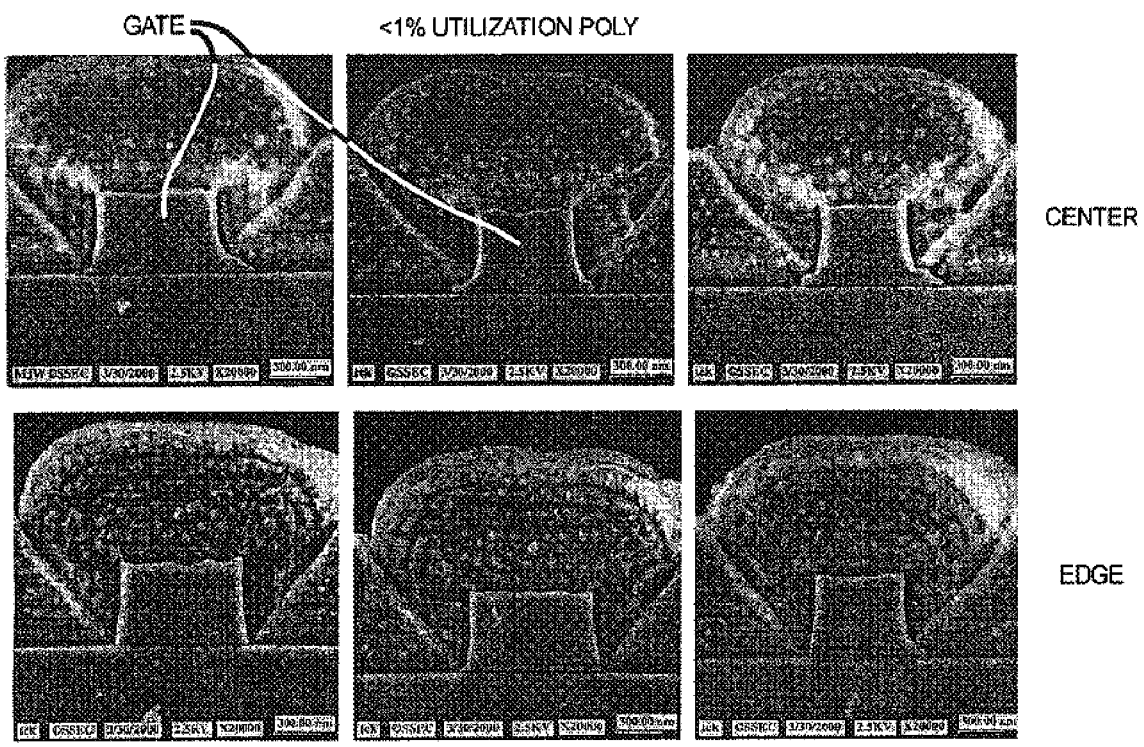
FIG. 7 shows gates following etching when polysilicon pads are not provided on the chip; and, FIG. 8 shows gates following etching when polysilicon pads are provided on the chip.

The polysilicon pads 142, 144, 146, 148, 150, 152, 154, 156, 158, 160, 162, and 164 are provided in order to add additional polysilicon so that the polysilicon gate regions 76, 86, and 96 are formed properly during polysilicon etching. For example, if the area of the chip is commensurate with the metal template 126 shown in FIG. 5, the ratio of the area of the polysilicon gates to the chip area is less than 1%. If these gates provide all of the polysilicon on the chip, the gates would have the appearances shown in FIG. 7 following etching. As can be seen from FIG. 7, the gates do not have vertical walls and, instead, have feet.

Figure 8:
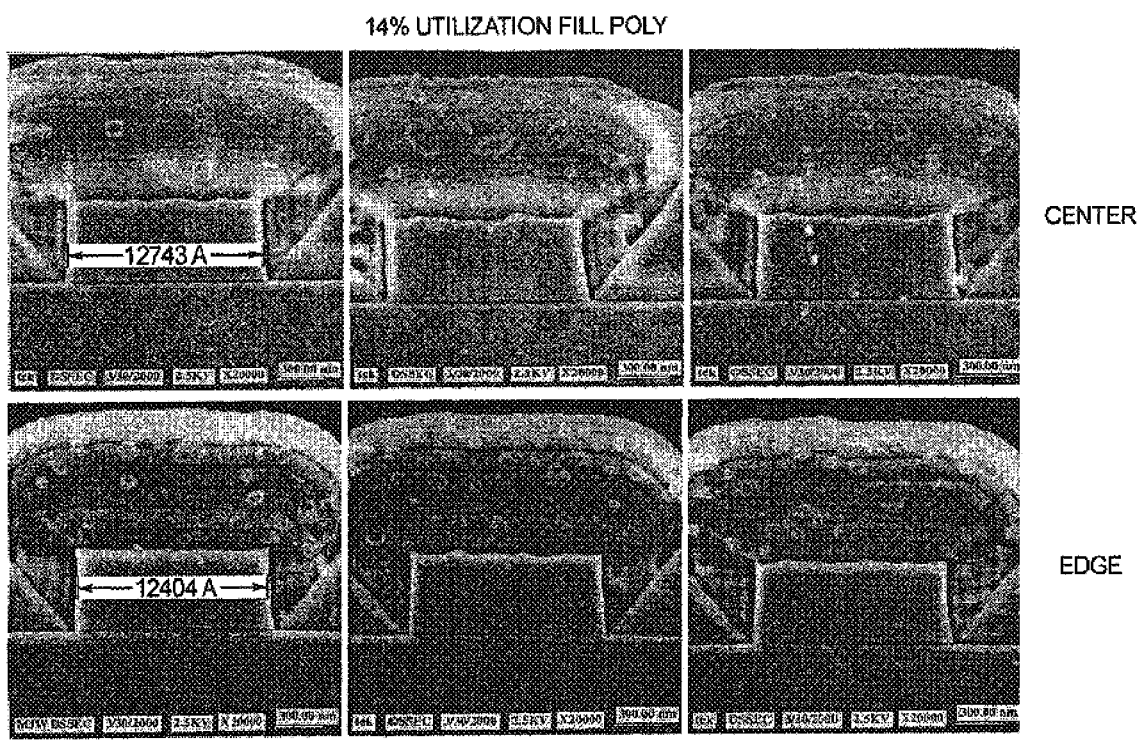

However, the ratio of the area of the polysilicon gates 22, 44, and 62 plus the area of the polysilicon pads 142, 144, 146, 148, 150, 152, 154, 156, 158, 160, 162, and 164 to the chip area is on the order of 14%. As a result, after gate etching, the polysilicon gate regions 76, 86, and 96 will have substantially vertical sides as shown in FIG. 8.

Moreover, by placing the polysilicon pads 142, 144, 146, 148, 150, 152, 154, 156, 158, 160, 162, and 164 under their corresponding probe pads 102, 106, 108, 112, 114, 118, 120, and 124, the polysilicon pads 142, 144, 146, 148, 150, 152, 154, 156, 158, 160, 162, and 164 do no adversely affect the operation of the semiconductor device 10. For example, if the semiconductor device 10 is operated as an RF switch, this placement of the polysilicon pads 142, 144, 146, 148, 150, 152, 154, 156, 158, 160, 162, and 164 results in substantially little RF coupling between the polysilicon of the polysilicon pads 142, 144, 146, 148, 150, 152, 154, 156, 158, 160, 162, and 164 and the polysilicon of the transistors 12, 14, and 16.

Modifications of the present invention will occur to those practicing in the art of the present invention. Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A semiconductor device comprising:
   first polysilicon forming circuit elements of the semiconductor device on a chip, wherein at least some of the circuit elements comprise polysilicon gates;
   second polysilicon forming polysilicon pads of the semiconductor device on the chip, wherein at least one of the polysilicon pads is on the chip, is located distally from the circuit elements, and is unconnected from the circuit elements; and,
   metal pads covering the polysilicon pads.

2. The semiconductor device of claim 1 wherein the first and second polysilicon are formed on the chip so that there is no metal coupling between the first and second polysilicon.

3. The semiconductor device of claim 1 wherein each of the polysilicon gates is on the order of $0.35\mu$ in length.

4. The semiconductor device of claim 1 wherein the polysilicon gates are divided into at least first and second groups, wherein the polysilicon gates of the first group are intercoupled, wherein the polysilicon gates of the second group are intercoupled, and wherein each of the polysilicon gates is on the order of 0.35 microns in length.

5. The semiconductor device of claim 1 wherein at least three of the metal pads covering the polysilicon pads are probe pads, wherein a first of the probe pads comprises an input of the semiconductor device, wherein a second of the probe pads comprises an output of the semiconductor device, and wherein a third of the probe pads comprises a control of the semiconductor device.

6. The semiconductor device of claim 5 wherein each of at least six metal pads covers a corresponding polysilicon pad.

7. The semiconductor device of claim 6 wherein each of at least ten metal pads covers a corresponding polysilicon pad.

8. The semiconductor device of claim 6 wherein the chip has an area, and wherein the first and second polysilicon comprise between 13% and 16% of the area of the chip.

9. The semiconductor device of claim 8 wherein the first polysilicon comprises 1% or less of the area of the chip.

10. The semiconductor device of claim 6 wherein the chip has an area, and wherein the first and second polysilicon comprise substantially 14% of the area of the chip.

11. The semiconductor device of claim 10 wherein the first polysilicon comprises 1% or less of the area of the chip.

12. The semiconductor device of claim 1 wherein at least a portion of the polysilicon gates form a gate of a transistor, wherein the transistor comprises alternating source and drain regions, and wherein each polysilicon gate of the transistor is between a pair of adjacent source and drain regions.

13. The semiconductor device of claim 12 further comprising at least one polysilicon resistor.

14. The semiconductor device of claim 1 wherein the first polysilicon forms all of the circuit elements of the semiconductor device, and wherein all of the polysilicon pads of the semiconductor device are located distally from the circuit elements.

15. A semiconductor device chip comprising:
   a first transistor comprising gate regions and alternating source and drain regions, wherein each gate region of the first transistor is between a pair of adjacent source and drain regions, and wherein each gate region of the first transistor comprises polysilicon;
   a second transistor comprising gate regions and alternating source and drain regions, wherein each gate region of the second transistor is between a pair of adjacent source and drain regions, and wherein each gate region of the second transistor comprises polysilicon;
   a third transistor comprising gate regions and alternating source and drain regions, wherein each gate region of the third transistor is between a pair of adjacent source and drain regions, and wherein each gate region of the third transistor comprises polysilicon;
   a plurality of polysilicon resistors;
   a plurality of non-capacitor polysilicon pads; and,
   contacts covering the non-capacitor polysilicon pads.

16. The semiconductor device chip of claim 15 wherein the gate regions of the first, second, and third transistors, the polysilicon resistors, and the polysilicon pads are arranged so that there is substantially little RF coupling between (i) the polysilicon of the first, second, and third transistors and of the resistors and (ii) the polysilicon of the polysilicon pads.

17. The semiconductor device chip of claim 15 wherein the amount of polysilicon of the gate regions, polysilicon resistors, and polysilicon pads permits a polysilicon etch to operate so that the gate regions have substantially vertical walls.

18. The semiconductor device chip of claim 15 wherein each of the gate regions of each of the first, second, and third transistors is on the order of $0.35\mu$ in length.

19. The semiconductor device chip of claim 15 wherein the plurality of polysilicon pads comprises at least three polysilicon pads covered by a corresponding number of the contacts, wherein a first of the contacts comprises an input of the semiconductor device chip, wherein a second of the contacts comprises an output of the semiconductor device chip, and wherein a third of the contacts comprises a control terminal of the semiconductor device chip.

20. The semiconductor device chip of claim 19 wherein the plurality of polysilicon pads comprises at least six polysilicon pads.

21. The semiconductor device chip of claim 19 wherein the plurality of polysilicon pads comprises at least ten polysilicon pads.

22. The semiconductor device chip of claim 15 having an area, wherein the polysilicon of the gate regions, the resistors, and the polysilicon pads comprises between 13% and 16% of the area of the semiconductor device chip.

23. The semiconductor device chip of claim 22 wherein the polysilicon of the gate regions comprises less than 1% of the area of the semiconductor device chip.

24. The semiconductor device chip of claim 15 having an area, wherein the polysilicon of the gate regions, the resistors, and the polysilicon pads comprise substantially 14% of the area of the semiconductor device chip.

25. The semiconductor device chip of claim 24 wherein the polysilicon of the gate regions comprises less than 1% of the area of the semiconductor device chip.

26. A semiconductor device comprising:
   a transistor having a gate, a source, and a drain, wherein the gate comprises a polysilicon gate;
   at least one polysilicon pad laterally distal and electrically isolated from all circuit elements of the semiconductor device; and,
   a metal pad covering the polysilicon pad.

27. The semiconductor device of claim 26 wherein the polysilicon gate and the polysilicon pad is formed on the chip so that there is no metal coupling between the polysilicon gate and the polysilicon pad.

28. The semiconductor device of claim 26 wherein the polysilicon gate is on the order of $0.35\mu$ in length.

29. The semiconductor device of claim 27 wherein the at least one polysilicon pad comprises a first polysilicon pad, wherein the metal pad comprises a first metal pad, and wherein the semiconductor device further comprises second and third polysilicon pads and second and third metal pads covering the second and third polysilicon pads, respectively, wherein the first metal pad comprises an input of the semiconductor device, wherein the second metal pad comprises an output of the semiconductor device, and wherein the third metal pad comprises a control of the semiconductor device.

30. The semiconductor device of claim 26 wherein the chip has a chip area, wherein all polysilicon on the chip has a total polysilicon area, and wherein the total polysilicon area comprises between 13% and 16% of the chip area.

31. The semiconductor device of claim 30 wherein all polysilicon forming gates on the chip has a total gate polysilicon area, and wherein the total gate polysilicon area comprises 1% or less of the chip area.

32. The semiconductor device of claim 26 wherein the chip has a chip area, wherein all polysilicon on the chip has a total polysilicon area, and wherein the total polysilicon area comprises substantially 14% of the chip area.

33. The semiconductor device of claim 32 wherein all polysilicon forming gates on the chip has a total gate polysilicon area, and wherein the total gate polysilicon area comprises 1% or less of the chip area.

34. A semiconductor chip comprising:
gate polysilicon forming at least one polysilicon gate;
non-gate polysilicon forming polysilicon pads on the chip; and,
metal pads covering the polysilicon pads, wherein the chip has a chip area, wherein the gate polysilicon and the non-gate polysilicon has a total polysilicon area, wherein the total polysilicon area comprises at least 13% of the chip area, wherein the gate polysilicon has a gate polysilicon area, and wherein the gate polysilicon area comprises 1% or less of the chip area.

* * * * *

UNITED STATES PATENT AND TRADEMARK OFFICE
CERTIFICATE OF CORRECTION

PATENT NO. : 6,674,108 B2
DATED : January 6, 2004
INVENTOR(S) : Yue et al.

It is certified that error appears in the above-identified patent and that said Letters Patent is hereby corrected as shown below:

Column 8,
Line 17, please change "has" to -- have --.

Signed and Sealed this

Seventeenth Day of August, 2004

JON W. DUDAS
*Acting Director of the United States Patent and Trademark Office*